United States Patent
Cho et al.

(10) Patent No.: US 9,881,969 B2
(45) Date of Patent: Jan. 30, 2018

(54) DISPLAY PANEL

(71) Applicant: INNOLUX CORPORATION, Jhu-Nan, Miao-Li County (TW)

(72) Inventors: Wei-Ching Cho, Jhu-Nan (TW); Hsia-Ching Chu, Jhu-Nan (TW); Kuei-Ling Liu, Jhu-Nan (TW)

(73) Assignee: INNOLUX CORPORATION, Jhu-Nan (TW)

( * ) Notice: Subject to any disclaimer, the term of this patent is extended or adjusted under 35 U.S.C. 154(b) by 0 days.

(21) Appl. No.: 15/098,865

(22) Filed: Apr. 14, 2016

(65) Prior Publication Data
US 2016/0329357 A1   Nov. 10, 2016

(30) Foreign Application Priority Data

May 5, 2015  (TW) .............................. 104114324 A

(51) Int. Cl.
*G09G 3/20* (2006.01)
*H01L 27/24* (2006.01)
(Continued)

(52) U.S. Cl.
CPC ........ *H01L 27/2418* (2013.01); *H01L 27/124* (2013.01); *H01L 27/1225* (2013.01); *H01L 29/7869* (2013.01); *H01L 29/78696* (2013.01)

(58) Field of Classification Search
CPC ............. H01L 27/1248; H01L 27/1225; H01L 27/124; H01L 29/7869; H01L 29/78696;
(Continued)

(56) References Cited

U.S. PATENT DOCUMENTS

2005/0157232 A1* 7/2005 Yoon ................. G02F 1/133555
349/114
2005/0179849 A1* 8/2005 Nomura ................ G02F 1/1345
349/149
(Continued)

FOREIGN PATENT DOCUMENTS

| CN | 1905163 | 1/2007 |
|---|---|---|
| JP | 2010-048837 | 3/2010 |
| JP | 2014-021472 | 2/2014 |

OTHER PUBLICATIONS

Notice of Reasons for Rejection issued by the Japan Patent Office for corresponding Japanese Patent Application No. 2015-138807 dated Jun. 21, 2016.

*Primary Examiner* — David Vu
*Assistant Examiner* — Mouloucoulaye Inoussa
(74) *Attorney, Agent, or Firm* — Liu & Liu

(57) ABSTRACT

In a display panel, a first substrate has an active area and a peripheral area around the active area. A first trace is located at the peripheral area and extends along a first direction. A second trace intersects the first trace to define a crossing area. The first trace and the second trace are electrically isolated at the crossing area. An insulation layer is disposed on the first trace and the second trace and has an opening region corresponding to the crossing area. The opening region exposes the crossing area. The switch element is adjacent to the opening region, and has an active layer. The active layer has a first width in parallel with the first direction, and the shortest distance between the opening region and the active layer in parallel with the first direction is larger than zero and smaller than the first width.

20 Claims, 6 Drawing Sheets

(51) Int. Cl.
*H01L 27/12* (2006.01)
*H01L 29/786* (2006.01)

(58) Field of Classification Search
CPC ........ G09G 5/00; G09G 3/20; G02F 1/13624;
G02F 1/136209
USPC ................................. 349/110, 156; 345/206
See application file for complete search history.

(56) References Cited

U.S. PATENT DOCUMENTS

| | | | |
|---|---|---|---|
| 2009/0231241 A1* | 9/2009 | Abe | G09G 3/2011 345/76 |
| 2010/0033646 A1* | 2/2010 | Baek | G02F 1/136209 349/42 |
| 2016/0104757 A1* | 4/2016 | Kim | H01L 27/3276 257/40 |

* cited by examiner

DISPLAY PANEL

CROSS REFERENCE TO RELATED APPLICATIONS

This Non-provisional application claims priority under 35 U.S.C. §119(a) on Patent Application No(s). 104114324 filed in Taiwan, Republic of China on May 5, 2015, the entire contents of which are hereby incorporated by reference.

BACKGROUND

Technical Field

The disclosure relates to a display panel, in particular to a display panel with better reliability.

Related Art

With the progress of technologies, flat display panels have been widely applied to various kinds of fields. Because of advantages such as compact structure, low power consumption and less radiation, they gradually take the place of cathode ray tube (CRT) display devices, and are widely applied to various electronic products, such as mobile phones, portable multimedia devices, notebooks, LCD TVs and LCD screens.

Taking liquid crystal display (LCD) panel for example, a conventional LCD panel mainly includes a thin film transistor (TFT) substrate, a color filter (CF) substrate and a liquid crystal layer. The TFT substrate and the CF substrate are disposed oppositely, and the liquid crystal layer is sandwiched between the two substrates so as to form a plurality of pixels. Herein, each pixel correspondingly has a TFT and a pixel electrode on a substrate. When the scan lines input scan signals to the gates of the TFTs of corresponding pixels, the data voltages from the data lines are inputted to the pixel electrodes through the source and drain of the TFT by controlling the TFT so that the liquid crystal molecules are controlled to steer so as to display an image.

Due to drastic competition in the market, demands of size and display color saturation of the display panel are also rapidly grown. The electrical characteristics and stability of TFT are also urged. Herein, the thin film transistor (hereinafter TFT) based on the metal oxide (oxide-TFT) is beneficial to good output current characteristics, low leakage current and electron mobility which is higher than ten times of that of the amorphous silicon TFT (a-Si TFT). It respectively reduces the power consumption of the display panel and enhances the operating frequency of the display panel. Therefore, it becomes the major driving element utilized in display panel.

However, although oxide-TFT has better electric characteristic, it is easily influenced by environment moisture and oxygen to change its electric characteristic and cause lower reliability of the display panel. Therefore, it is an important subject to provide a display panel which resists moisture and oxygen so as to enhance the product reliability.

SUMMARY

An objective of the disclosure is to provide a display panel which resists moisture and oxygen so as to enhance the product reliability.

To achieve the above objective, a display panel includes a first substrate, a second substrate, a display medium layer, a first trace, a second trace, an insulation layer and a switch element. The first substrate has an active area and a peripheral area around the active area. The display medium layer is disposed between the first substrate and the second substrate. The first trace is disposed on the first substrate and correspondingly located at the peripheral area, and extends along a first direction. The second trace is disposed on the first substrate and intersects the first trace to define a crossing area. The first trace and the second trace are electrically isolated at the crossing area. The insulation layer is disposed on the first trace and the second trace and has an opening region correspondingly located at the crossing area. The opening region exposes the crossing area. The switch element is disposed on the first substrate and adjacent to the opening region, and has an active layer. The active layer has a first width in parallel with the first direction, and the shortest distance between the opening region and the active layer in parallel with the first direction is larger than zero and smaller than the first width.

To achieve the above objective, a display panel includes a first substrate, a second substrate, a display medium layer, a first trace, a second trace, an insulation layer and a switch element. The first substrate has an active area and a peripheral area around the active area. The display medium layer is disposed between the first substrate and the second substrate. The first trace is disposed on the first substrate and correspondingly located at the peripheral area, and extends along a first direction. The second trace is disposed on the first substrate and intersects the first trace to define a crossing area. The first trace and the second trace are electrically isolated at the crossing area. The insulation layer is disposed on the first trace and the second trace, and has an opening region correspondingly located at the crossing area. The opening region exposes the crossing area. The switch element is disposed on the first substrate and adjacent to the crossing area, and has an active layer. The shortest distance between the active layer and the opening region is larger than 1 µm and smaller than 20 µm.

In one embodiment, a plurality of the crossing areas are located within the opening region.

In one embodiment, the material of the active layer is metal-oxide-semiconductor.

In one embodiment, the insulation layer comprises a plurality of the opening regions which are adjacent to the active layer of the switch element.

In one embodiment, the crossing area has a first end and a second end opposite each other in parallel with the first direction, the shortest distance from the first end to the edge of the opening region is not equal to the shortest distance from the second end to the edge of the opening region.

In one embodiment, the opening region further exposes a part of the first trace and a part of the second trace, and the edge slopes of the insulation layer respectively corresponding to the part of the first trace and the part of the second trace are different.

In one embodiment, the opening region further exposes a zone excluding the first trace and the second trace, and the edge slopes of the insulation layer respectively corresponding to the part of the first trace and the zone are different.

In one embodiment, the display panel further includes a contact hole region which is disposed adjacent to the opening region and has a second width in a second direction substantially perpendicular to the first direction. The shortest distance between the opening region and the contact hole region is larger than zero and smaller than the second width.

In one embodiment, the insulation layer includes a plurality of the opening regions adjacent to the contact hole region.

In one embodiment, the display medium layer is a liquid crystal layer or an organic light-emitting diode layer.

As mentioned above, as to the display panel, the first trace and the second trace at the peripheral area intersect to define a crossing area, the insulation layer has the opening region correspondingly located at the crossing area, and the opening region can expose the crossing area. Moreover, the switch element is adjacent to the opening region and has an active layer. The shortest distance between the opening region and the active layer is larger than zero and smaller than the first width of the active layer in parallel with the first direction. Because the erosion and the bad influence of electrical characteristic of the active layer of the switch element is easily caused by the moisture or oxygen, the third insulation layer adjacent to the active layer is penetrated through to form the opening region so as to block the entrance path of moisture or oxygen. Therefore, the display panel has better capability of blocking moisture or oxygen and the product reliability is enhanced. Moreover, the opening region is formed on the insulation layer at the peripheral area so as to restrict impurities or ions to the opening region so that impurities or ions have less influences on the display medium layer, and it avoids impurities from influencing the display effect of the display panel.

BRIEF DESCRIPTION OF THE DRAWINGS

The embodiments will become more fully understood from the detailed description and accompanying drawings, which are given for illustration only, and thus are not limitative of the present disclosure, and wherein.

DETAILED DESCRIPTION

The embodiments of the disclosure will be apparent from the following detailed description, which proceeds with reference to the accompanying drawings, wherein the same references relate to the same elements.

Figure 1A:
FIG. 1A is a sectional schematic diagram showing a display panel according to the embodiment of the disclosure.
Figure 1B:
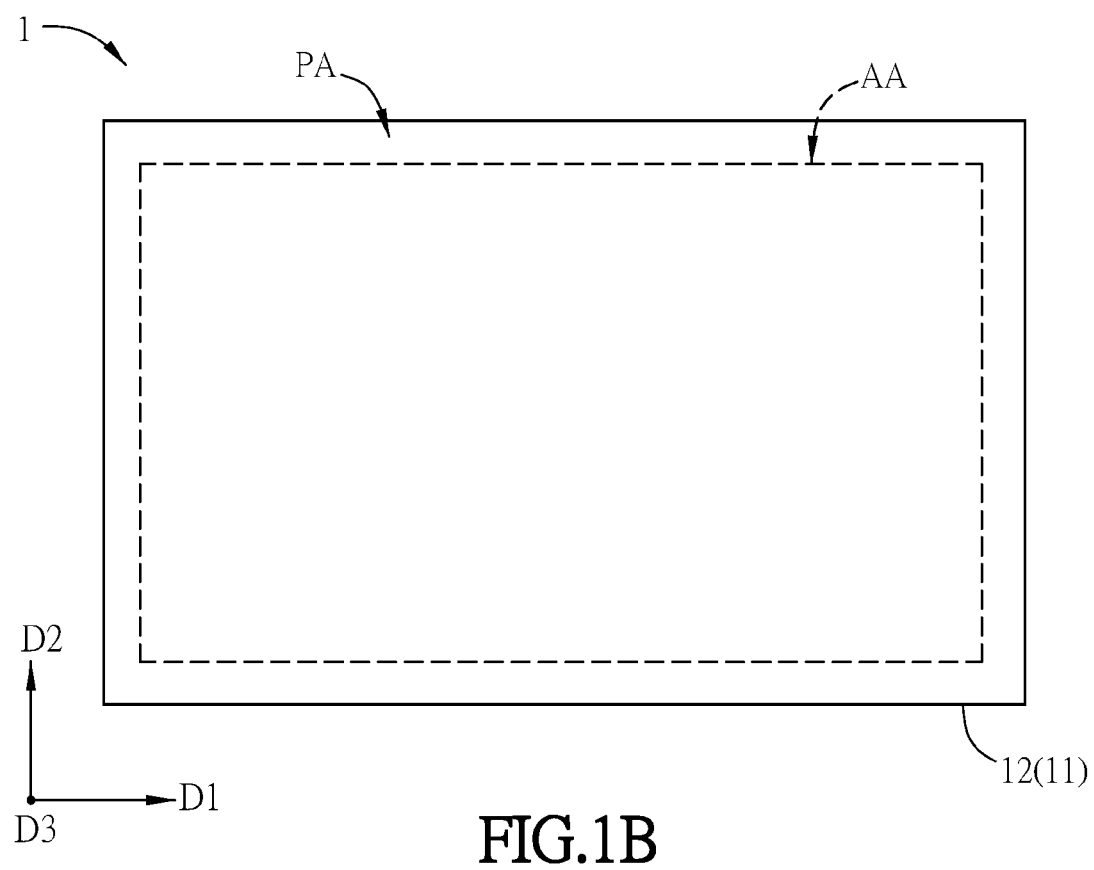
FIG. 1B is a top view of the display panel in FIG. 1A.
Figure 1C:
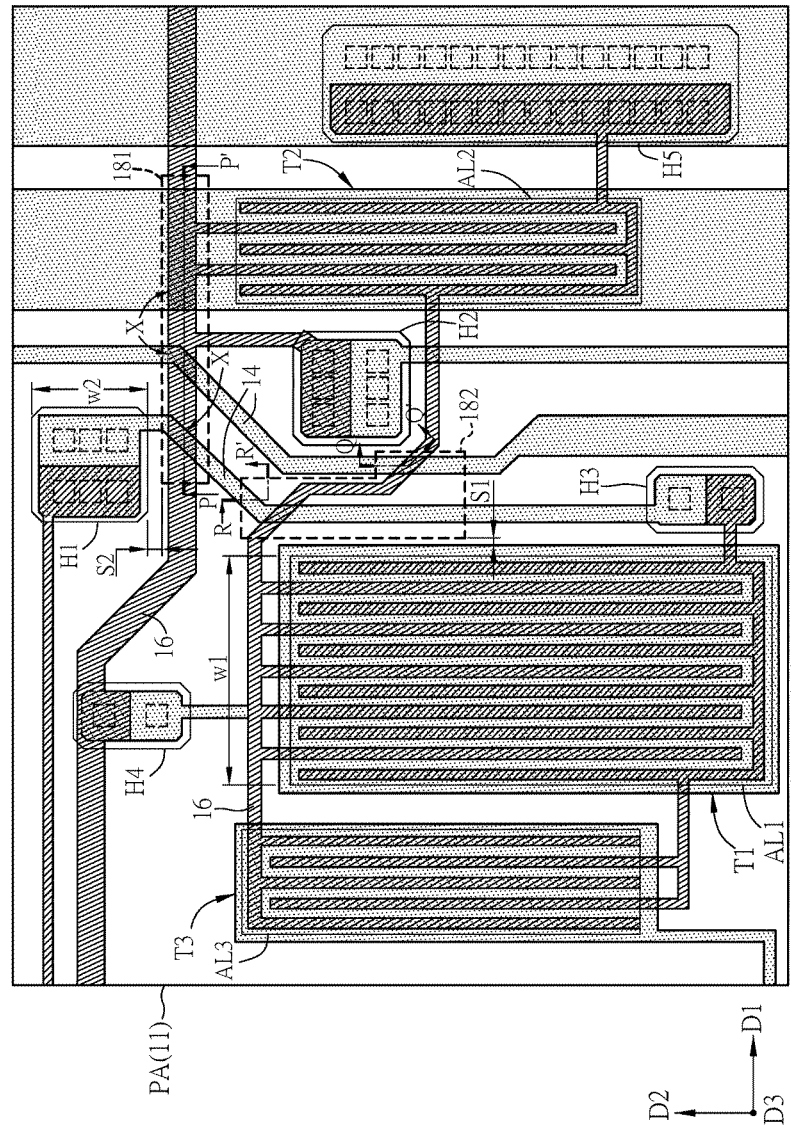
FIG. 1C is a schematic diagram showing the layout of the peripheral area of the first substrate of one embodiment in the display panel in FIG. 1B.
Figure 1D:
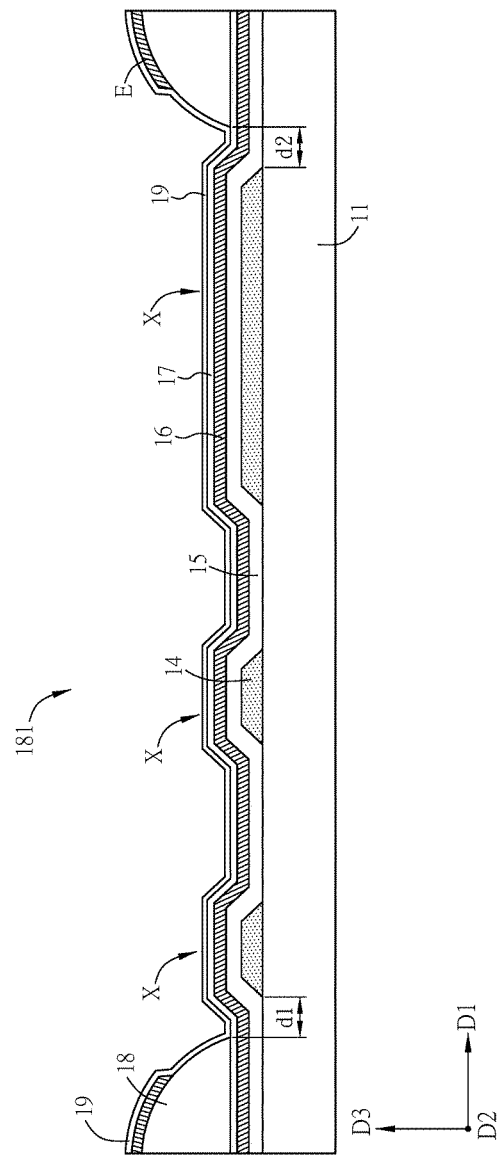
FIG. 1D is a sectional schematic diagram along line P-P' in FIG. 1C.
Figure 1E:
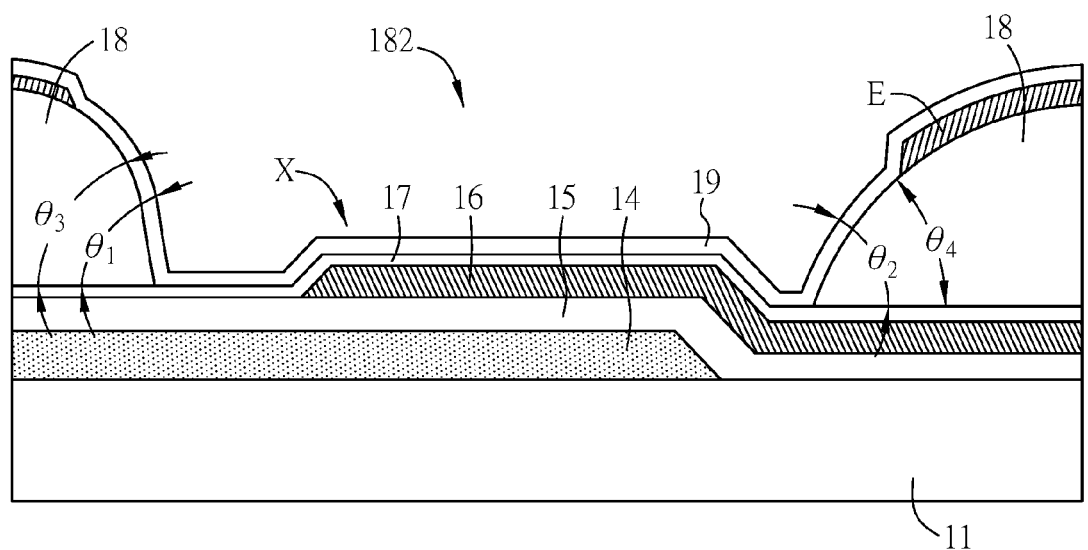
FIG. 1E is a sectional schematic diagram along line Q-Q' in FIG. 1C.
Figure 1F:
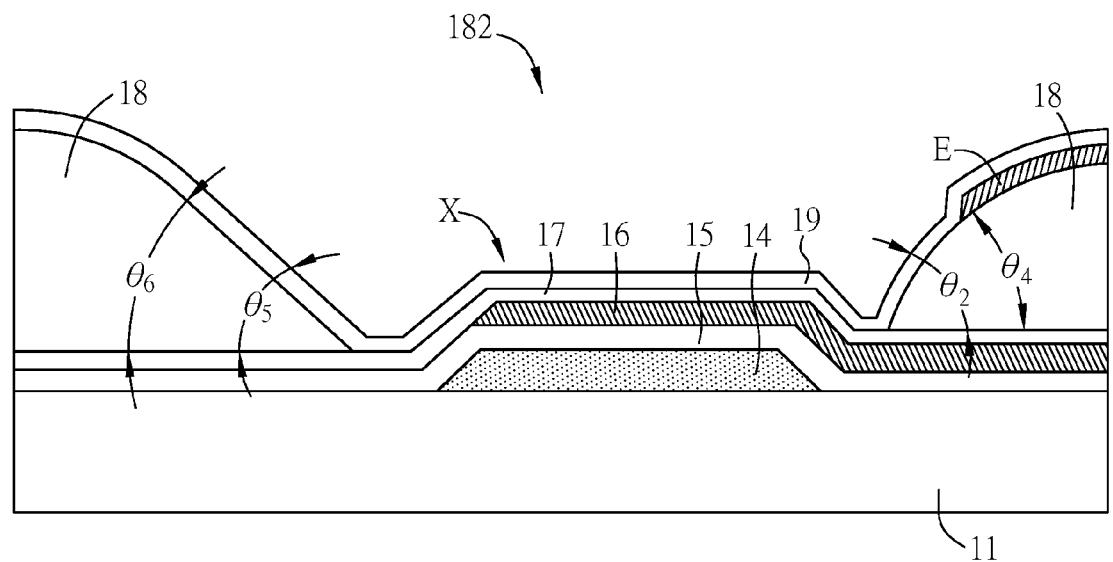
FIG. 1F is a sectional schematic diagram along line R-R' in FIG. 1C.

Referring to FIG. 1A to FIG. 1F, FIG. 1A is a sectional schematic diagram showing a display panel according to the embodiment of the disclosure, FIG. 1B is a top view of the display panel in FIG. 1A, FIG. 1C is a schematic diagram showing the layout of the peripheral area PA of the first substrate 11 of one embodiment in the display panel 1 in FIG. 1B, FIG. 1D is a sectional schematic diagram along line P-P' in FIG. 1C, FIG. 1E is a sectional schematic diagram along line Q-Q' in FIG. 1C, and FIG. 1F is a sectional schematic diagram along line R-R' in FIG. 1C.

The display panel 1 can be an LCD (liquid crystal display) panel or an OLED (organic light-emitting diode) display panel. In the embodiment, it is an LCD panel for example, and it may be a FFS (Fringe Field Switching) type LCD panel, IPS (In Plane Switching) type LCD panel, TN (Twisted Nematic) LCD panel, or VA (Vertical Alignment) type LCD panel, which is not limited thereto. Moreover, the figure shows a first direction D1, a second direction D2 and a third direction D3. Any two of the first direction D1, the second direction D2 and the third direction D3 are substantially perpendicular to each other. The first direction D1 is substantially parallel to the extending direction of the scan lines of the active area, the second direction D2 is substantially parallel to the extending direction of the data lines of the active area, and the third direction D3 is another direction which is substantially perpendicular to the first direction D1 and the second direction D2. Alternatively, in other embodiments, the first direction D1 can be substantially parallel to the extending direction of the data lines, the second direction D2 can be substantially parallel to the extending direction of the scan lines, the third direction D3 is another direction which is substantially perpendicular the first direction D1 and the second direction D2, and they are not limited thereto. Moreover, the line P-P' in FIG. 1C is parallel to the first direction D1.

Referring to FIG. 1A and FIG. 1B, the display panel 1 includes a first substrate 11, a second substrate 12 and a display medium layer 13.

The first substrate 11 has an active area AA and a peripheral area PA around the active area AA. The active area AA is a zone (for displaying image) of the first substrate 11 which most light beam can pass through, and the peripheral area PA is a zone for disposing peripheral drive (switch) elements and wiring, for example the zone for gate driving circuit (Gate on Panel, GOP). In the embodiment, the peripheral area PA encloses the fringes of the active area AA for example. In other embodiments, the peripheral area PA may not enclose the fringes of the active area AA and depend on the design requirement.

The first substrate 11 is disposed opposite the second substrate 12, and the display medium layer 13 is sandwiched between the first substrate 11 and the second substrate 12. The first substrate 11 and the second substrate 12 can be made by transparent material, for example a glass substrate, a quartz substrate, a plastic substrate, a flexible substrate, a barrier layer (film) or a protective layer (film) and it is not limited thereto. In the embodiment, the first substrate 11 can be a TFT (thin film transistor) substrate, and the second substrate 12 can be a CF (color filter) substrate. In the embodiment, the display medium layer 13 is a liquid crystal layer, and it has a plurality of liquid crystal molecules (not shown) so that the display panel 1 is an LCD panel. In other embodiments, when the display panel 1 is an OLED display panel, the display medium layer 13 can be an OLED layer. In one embodiment, when the OLED layer emits white light, the second substrate 12 can be a CF substrate. In other embodiments, when the OLED layer emits color light respectively, for example red, green or blue light, the second substrate 12 can be a cover plate or a barrier film to protect the OLED layer from environment moisture or pollution of foreign object.

Referring to FIG. 1C and FIG. 1D, in the embodiment, the display panel 1 further includes a first trace 14, a first insulation layer 15, a second trace 16, a second insulation layer 17, a third insulation layer 18 (or called insulation layer 18), at least one switch element, an alignment layer 19 and an electrode layer E at the peripheral area PA. For the sake of clarity, FIG. 1C shows the first trace 14, the second trace 16 and three switch elements T1, T2, T3, but other layers or films are not shown. In the embodiment, the third insulation layer 18 has two opening regions 181, 182. The opening regions 181, 182 represent that the third insulation layer 18 is removed from the opening regions 181, 182 and the insulation layer does not exist. Besides, in other embodiments, the opening region is disposed on demand, and its quantity and shape are not limited so it may be irregular shape.

The first trace 14 is disposed on the first substrate 11 and correspondingly located at the peripheral area PA. Here, as shown in FIG. 1C, in the opening region 181, the first trace 14 extends along the second direction D2. However, at different positions of the peripheral area PA, the first trace 14 may extend along the first direction D1 or extent obliquely, and it is not limited thereto. The first trace 14 can be formed by a conductive layer, and its material can be metal (for example aluminum, copper, silver, molybdenum, or titanium) or single-layer structure or multi-layer structure of their alloy. The first trace 14 can be applied to the gate (not labeled) of the TFT (for example the switch elements T1, T2, T3) and the scan lines.

The first insulation layer 15 is disposed on the first trace 14 and the first substrate 11. The first insulation layer 15 can be organic material for example organic silicon oxide compounds, or it can be inorganic material for example silicon nitride, silicon oxide, nitrogen silicon oxide, silicon carbide, alumina, hafnium oxide, or multi-layer structure of above materials. In the embodiment, the first insulation layer 15 covers at least a part of the first trace 14, and it may alternatively partially or fully cover the first substrate 11.

The second trace 16 is disposed on the first substrate 11 and the first trace 14. In the opening region 181, the first trace 14 and the second trace 16 intersect to define at least a crossing area X, and the first trace 14 and the second trace 16 at the crossing area X are electrically isolated. The second trace 16 can be a conductive layer, its material also can be metal (for example aluminum, copper, silver, molybdenum, or titanium) or single-layer structure or multi-layer structure of their alloy. The second trace 16 can be applied to the drain or the source (not labeled) of the TFT (for example the switch elements T1, T2, T3) or data lines. Because the first trace 14 and the second trace 16 are conductive material but in distinct layers, they are electrically isolated due to the first insulation layer 15 therebetween.

The second insulation layer 17 is disposed on and at least partially overlaps the second trace 16. The second insulation layer 17 can be organic material for example organic silicon oxide compounds, or it can be inorganic material for example silicon nitride, silicon oxide, nitrogen silicon oxide, silicon carbide, alumina, hafnium oxide, or multi-layer structure of above materials.

The third insulation layer 18 is disposed on the first trace 14 and the second trace 16. In the embodiment, the third insulation layer 18 is disposed on the second insulation layer 17, and the third insulation layer 18 has two opening regions 181, 182. The opening region 181 is correspondingly disposed at three crossing areas X of the first trace 14 and the second trace 16, so that the opening region 181 can expose three crossing areas X. However, in another opening region 182, the first trace 14 and the second trace 16 intersect to define two crossing areas (not labeled). Moreover, in the embodiment, the opening region 181 not only exposes three crossing areas X, and the opening region 181 also exposes a part of the first trace 14 and a part of the second trace 16. The material of the third insulation layer 18 can be PFA (Polyfluoroalkoxy). Furthermore, in the embodiment, the opening regions 181, 182 are the zones formed from a bottom edge of the third insulation layer 18 to another bottom edge of the third insulation layer 18. In other words, in the opening regions 181, 182, the third insulation layer 18 is removed so that the opening regions 181, 182 contain no third insulation layer 18 and the ranges of the opening regions 181, 182 are the zone formed from the bottom edge of the third insulation layer 18 to the another bottom edge. In other embodiments, the number of the crossing areas in the opening region is not limited and dependent on design demand.

Moreover, the crossing area X has a first end and a second end opposite each other in parallel with the first direction D1. The shortest distance from the first end to the edge of the opening region is not equal to the shortest distance from the second end to the edge of the opening region. Taking the opening region 181 for example, referring to FIG. 1D, the opening region 181 comprises three first traces 14. In parallel with the first direction D1, the shortest distance d1 measuring from the bottom of the first trace 14 at the left side to the bottom edge of the opening region 181 is not equal to the shortest distance d2 measuring from the bottom of the first trace 14 at right side to the bottom edge of the opening region 181 (d1≠d2).

Moreover, referring to FIG. 1E, the edge slope of the third insulation layer 18 corresponding to the part of the first trace 14 is not the same with the edge slope of it corresponding to the part the second trace 16. In other words, the third insulation layer 18 at the edges of the opening region has different slopes on the first trace 14 and the second trace 16. In detail, taking the opening region 182 for example, the edge slope of the alignment layer 19 at left side is not the same with the edge slope of the alignment layer 19 at right side (namely, the angle θ1≠the angle θ2). The edge angle of the third insulation layer 18 at left side is also not the same with the edge angle of the third insulation layer 18 at right side (namely, the angle θ3≠the angle θ4). Besides, referring FIG. 1F, in the opening region 182, a zone excluding the first trace 14 and the second trace 16 is exposed. Taking the opening region 182 for example, the edge slope of the alignment layer 19 at left side is not the same with the edge slope of the alignment layer 19 at right side (namely, the angle θ5≠the angle θ2). Besides, the edge angle of the third insulation layer 18 at left side is also not the same with the edge angle of the third insulation layer 18 at right side (namely the angle θ6≠the angle θ4) In other words, the third insulation layer 18 has different slopes at the edges of the opening region 182 for example on the first trace 14 and not on the first trace 14. In other embodiments, a first side edge of the third insulation layer 18 at the edge of the opening region 182 is located on the first trace 14, a second side edge of the third insulation layer 18 at the edge of the opening region 182 is located at a zone excluding the first trace 14 and the second trace 16 (not shown). The edge slopes of the two sides of the alignment layer 19 at the first side edge and the second side edge are not the same (namely the angle θ1≠the angle θ5). The edge angle of the third insulation layer 18 at the edge of the first side edge and the edge of the second side edge are also not the same (namely the angle θ3≠the angle θ6).

In the embodiment, the third insulation layer 18 is dug through to form the opening region 182 which can block, reduce or prolong the entrance path of moisture or oxygen along the third insulation layer 18 into the active area, so that the display panel 1 has better capability of blocking moisture or oxygen and the product reliability is enhanced. In the embodiment, the opening regions 181, 182 are formed on the third insulation layer 18 at the peripheral area PA so as to restrict or trap impurities ions in the opening regions 181, 182 at the peripheral area PA because impurities or ions are easily influenced by the electrical characteristics of the trace-crossing area, so that impurities or ions have less influences on the display medium layer 13 at the active area AA, and it also reduces the influences on the display quality of the display panel 1. It is also noted that in the embodiment, the opening regions 181, 182 on the third insulation layer 18 which expose the trace-crossing areas for wiring also can conveniently be applied to electrical test or repair.

Referring to FIG. 1C again, the switch elements T1, T2, T3 can be switch drive elements, and they can act as control switches for electrically connecting elements in the peripheral area PA and the active area AA. The switch elements T1, T2, T3 can be TFTs disposed on the first substrate 11. In the embodiment, referring to FIG. 1C, the active layers AL1, AL2, AL3 at different locations are sandwiched between the first trace 14 and the second trace 16 at different locations, and the second trace 16 at different locations respectively contact the active layers AL1, AL2, AL3, so that the first trace 14, the second trace 16 and the active layers AL1, AL2, AL3 form the switch elements T1, T2, T3. The material of the active layers AL1, AL2, AL3 includes for example oxide-semiconductor. The oxide-semiconductor includes oxide which has one of indium, gallium, zinc and tin, for example indium gallium zinc oxide (IGZO). In other embodiments, the material of the active layers AL1, AL2, AL3 may be amorphous silicon (a-Si), but is not limited.

Besides, in the switch elements T1, T2, T3, the first trace 14 and the second trace 16 are like comb. The first trace 14 in the switch elements T1, T2, T3 can act as the gates of the TFTs. The second trace 16 in the switch elements T1, T2, T3 can act as the sources and the drains of the TFTs. Besides, in the embodiment, the switch element T1 is adjacent to the opening region 182. The active layer AL1 of the switch element T1 has a first width in a direction, and the shortest distance between the opening region 182 and the active layer AL1 in parallel with the direction is larger than zero and smaller than the first width (0<the shortest distance<the first width). In the embodiment, the shortest distance between the opening region 182 and the active layer AL1 in parallel with the first direction D1 is the shortest distance S1 measuring from the edge of the opening region 182 to the edge of the active layer AL1. The active layer AL1 has the first width w1 in parallel with the first direction D1, and the shortest distance S1 is larger than zero and smaller than the first width w1 (0<the shortest distance S1<the first width w1). The edge of the opening region 182 means the bottom edge of the third insulation layer 18, the edge of the active layer AL1 means the bottom edge of the active layer AL1.

In one embodiment, the shortest distance S1 between the active layer AL1 and the opening region 182 in parallel with the first direction D1 can be larger than 1 μm and smaller than or equal to 20 μm (1 μm<the shortest distance S1≤20 μm). In other embodiments, the shortest distance (not labeled in figure) between the active layer AL1 and the opening region 182 in parallel with the second direction D2 can be larger than 1 μm and smaller than or equal to 20 μm (1 μm<the shortest distance≤20 μm). In addition to the opening region 182, in the embodiment, the opening region 181 is also adjacent to the active layer AL1 of the switch element T1, and it is also adjacent to the active layer AL2 of the switch element T2.

In addition, the display panel 1 further includes at least a contact hole region H1 at the peripheral area PA. The contact hole region H1 comprises at least a contact hole. The first trace 14 and the second trace 16 are electrically connected by the contact hole region H1. In the embodiment, there are five contact hole regions H1~H5 for example. Moreover, the opening region 181 is adjacent to the contact hole region H1, and the opening region 182 is adjacent to the contact hole region H2. Moreover, the contact hole region H1 has a second width in a direction, and the shortest distance between the opening region 181 and the contact hole region H1 is larger than zero and smaller than the second width. In the embodiment, the contact hole region H1 has the second width w2 along the second direction D2, and the shortest distance S2 between the opening region 181 and the contact hole region H1 is larger than zero and smaller than the second width w2 (0<the shortest distance S2<the second width w2). In other embodiments, the contact hole region H1 also has a second width (not labeled in figure) along the first direction D1, and the shortest distance (not labeled in figure) between the opening region 181 and the contact hole region H1 is larger than zero and smaller than the second width.

On the condition that the shortest distance between the opening region and the active layer or between the opening region and the contact hole conforms to the design range mentioned above, the penetrating path of the moisture is cutting or blocking by the opening region disposed near the active layer or contact hole in a certain distance when the moisture or oxygen entering the display panel along the insulation layer. The opening region can block moisture from influencing the electrical characteristics or reliability of the active layer or the contact hole.

Referring to FIG. 1D again, the electrode layer E is disposed on the third insulation layer 18, and the alignment layer 19 is disposed on the second insulation layer 17, the third insulation layer 18 and the electrode layer E. The material of the electrode layer E can be for example but not limited to Indium tin oxide (ITO), Indium zinc oxide (IZO), Aluminum zinc oxide (AZO), Cadmium tin oxide (CTO), Tin oxide (SnO2), Zinc oxide (ZnO), or other transparent conductive material. In addition, the material of the alignment layer 19 can be for example but not limited to (polyimide, PI).

Accordingly, in the embodiment, the first trace 14 and the second trace 16 at the peripheral area PA in the display panel 1 intersect to define at least one crossing area X, the third insulation layer 18 is disposed on the first trace 14 and the second trace 16, the third insulation layer 18 has an opening region 182 correspondingly located at the crossing area X, and the opening region 182 exposes the crossing area X. Moreover, the switch element T1 is adjacent to the opening region 182 and has the active layer AL1. The shortest distance between the opening region 182 and the active layer AL1 is larger than zero and smaller than the first width w1 of the active layer AL1 in parallel with the first direction D1. Because the erosion and the bad influence of electrical characteristic of the active layer of the switch element is easily caused by the moisture or oxygen, in the embodiment, the third insulation layer 18 adjacent to the active layer AL1 is dug through to form the opening region 182 so as to block the penetrating path of moisture or oxygen along the third insulation layer 18. Therefore, the display panel 1 has better capability of blocking moisture or oxygen and the reliability is enhanced. Moreover, in the embodiment, the opening regions 181, 182 are formed on the third insulation layer 18 so as to restrict impurities ions to the opening regions 181, 182 (trap) so that impurities or ions have less influences on the display medium layer 13, and it avoids impurities from influencing the display effect of the display panel 1. It is also noted that in the embodiment, the opening regions 181, 182 on the third insulation layer 18 also can conveniently be applied to electrical test or repair.

Figure 2:
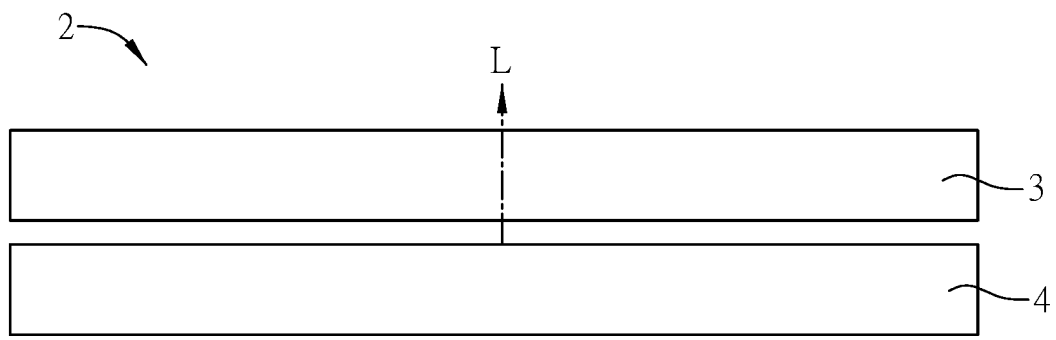
FIG. 2 is a schematic diagram showing a display device according to the embodiment of the disclosure.
Figure 3:
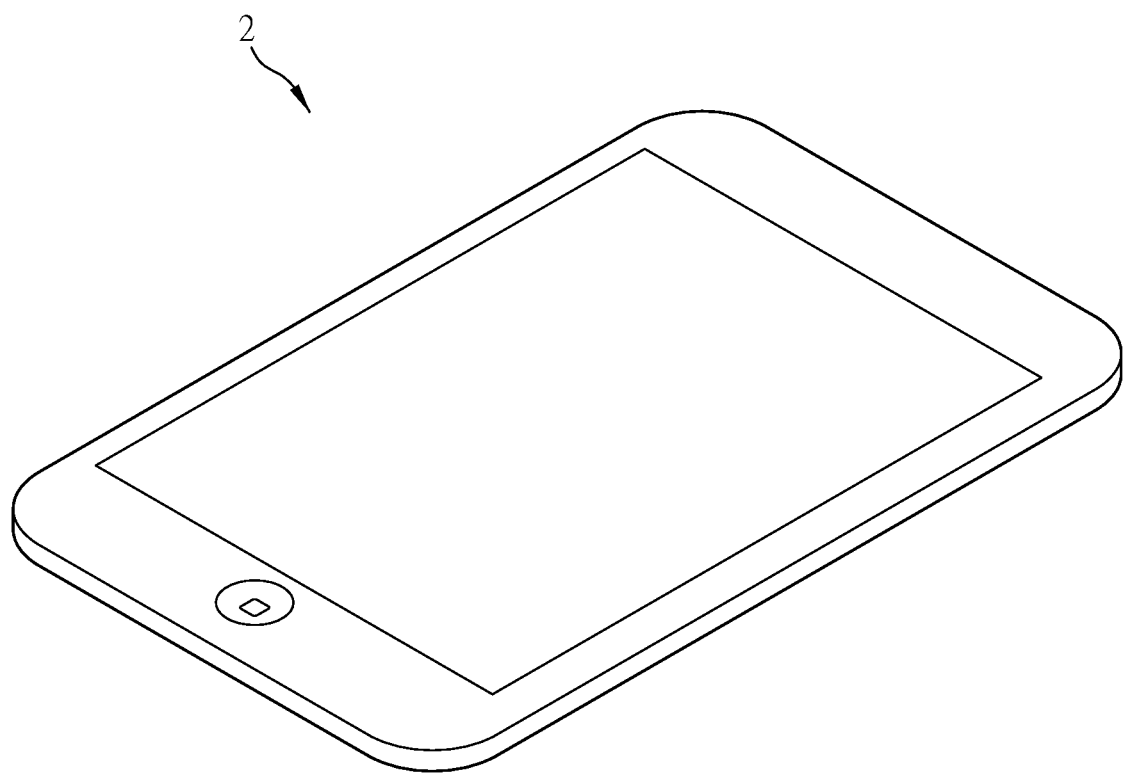
FIG. 3 is a perspective schematic diagram showing the display device according to the embodiment of the disclosure.

Moreover, referring to FIG. 2 and FIG. 3, FIG. 2 is a schematic diagram showing a display device 2 according to the embodiment of the disclosure, and FIG. 3 is a perspective schematic diagram showing the display device 2 according to the embodiment of the disclosure.

The display device 2 includes a display panel 3 and a backlight module 4. The display panel 3 and the backlight module 4 are disposed opposite each other. The display device 2 is a liquid display device, and the display panel 3 can be the display panel 1 mentioned above or other variation. Because it can refer to the content mentioned above, it is not repeated here. When the light beam L which is emitted from the backlight module 4 passes through the display panel 3, an image is formed by the pixels of the display panel 3 displaying colors.

As mentioned above, as to the display panel, the first trace and the second trace at the peripheral area intersect to define a crossing area, the insulation layer has the opening region correspondingly located at the crossing area, and the opening region can expose the crossing area. Moreover, the switch element is adjacent to the opening region and has an active layer. The shortest distance between the opening region and the active layer is larger than zero and smaller than the first width of the active layer in parallel with the first direction. Because the erosion and the bad influence of electrical characteristic of the active layer of the switch element is easily caused by the moisture or oxygen, the third insulation layer adjacent to the active layer is penetrated through to form the opening region so as to block the entrance path of moisture or oxygen. Therefore, the display panel has better capability of blocking moisture or oxygen and the product reliability is enhanced. Moreover, the opening region is formed on the insulation layer at the peripheral area so as to restrict impurities or ions to the opening region so that impurities or ions have less influences on the display medium layer, and it avoids impurities from influencing the display effect of the display panel. In addition, the crossing area for wiring exposed from the opening region also can conveniently be applied to electrical test or repair.

Although the disclosure has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the disclosure.

What is claimed is:

1. A display panel, comprising:
   a first substrate, having an active area and a peripheral area outside the active area;
   a second substrate;
   a display medium layer, disposed between the first substrate and the second substrate;
   a first trace, disposed on the first substrate and correspondingly located at the peripheral area;
   a first insulation layer disposed on the first trace;
   a second trace, disposed on the first substrate, and an overlapping area of the second trace and the first trace is defined as a crossing area, wherein the first trace and the second trace are electrically isolated at the crossing area, wherein the crossing area is located at the peripheral area;
   a second insulation layer disposed on the second trace;
   a third insulation layer, disposed on the second insulation layer, and having an opening region, wherein the opening region is located at the peripheral area and has a longest edge, and the crossing area is overlapping the opening region; and
   a switch element, disposed on the first substrate and adjacent to the opening region, and the switch element having an active layer, wherein the switch element is located at the peripheral area, the active layer has a first width in a direction perpendicular to the longest edge of the opening region, and a shortest distance between a projection of the longest edge of the opening region on the first substrate and a projection of the active layer on the first substrate in the direction perpendicular to the longest edge of the opening region is larger than zero and smaller than the first width.

2. The display panel of claim 1, wherein a plurality of the crossing areas are located within the opening region.

3. The display panel of claim 1, wherein the material of the active layer is metal-oxide-semiconductor.

4. The display panel of claim 1, wherein the third insulation layer comprises a plurality of the opening regions, the opening regions are adjacent to the active layer of the switch element.

5. The display panel of claim 1, wherein the crossing area has a first end and a second end opposite each other in parallel with a first direction which the first trace extends, a shortest distance from the first end to a side of the opening region is not equal to a shortest distance from the second end to an opposite side of the opening region.

6. The display panel of claim 1, wherein side slopes of the third insulation layer respectively corresponding to a part of the first trace and a part of the second trace are different.

7. The display panel of claim 6, wherein the opening region further exposes a zone excluding the first trace and the second trace, and the side slopes of the third insulation layer respectively corresponding to the part of the first trace and the zone are different.

8. A display panel, comprising:
   a first substrate, having an active area and a peripheral area outside the active area;
   a second substrate;
   a display medium layer, disposed between the first substrate and the second substrate;
   a first trace, disposed on the first substrate and correspondingly located at the peripheral area:
   a first insulation layer disposed on the first trace;
   a second trace, disposed on the first substrate, and an overlapping area of the second trace and the first trace is defined as a crossing area, wherein the first trace and the second trace are electrically isolated at the crossing area, wherein the crossing area is located at the peripheral area;
   a second insulation layer disposed on the second trace;
   a third insulation layer, disposed on the second insulation layer, and having an opening region, wherein the opening region is located at the peripheral area and has a longest edge, and the crossing area is overlapping the opening region; and
   a contact hole region, disposed adjacent to the opening region, and having a second width in a direction substantially perpendicular to the longest edge of the opening region, and a shortest distance between the opening region and the contact hole region in the direction substantially perpendicular to the longest edge of the opening region is larger than zero and smaller than the second width.

9. The display panel of claim 8, wherein the third insulation layer comprises a plurality of the opening regions adjacent to the contact hole region.

10. The display panel of claim 1, wherein the display medium layer is a liquid crystal layer or an organic light-emitting diode layer.

11. A display panel, comprising:
a first substrate, having an active area and a peripheral area around the active area;
a second substrate;
a display medium layer, disposed between the first substrate and the second substrate;
a first trace, disposed on the first substrate and correspondingly located at the peripheral area;
a first insulation layer disposed on the first trace;
a second trace, disposed on the first substrate, and an overlapping area of the second trace and the first trace is defined as a crossing area, wherein the first trace and the second trace are electrically isolated at the crossing area, wherein the crossing area is located at the peripheral area;
a second insulation layer disposed on the second trace;
a third insulation layer, disposed on the second insulation layer, and having an opening region, wherein the opening region is located at the peripheral area and has a longest edge, and the crossing area is overlapping the opening region; and
a switch element, disposed on the first substrate and adjacent to the crossing area, and the switch element having an active layer, wherein the switch element is located at the peripheral area, the active layer has a first width in a direction perpendicular to the longest edge of the opening region, and a shortest distance between a projection of the active layer on the first substrate and a projection of the longest edge of the opening region on the first substrate in the direction perpendicular to the longest edge of the opening region is larger than 1 μm and smaller than 20 μm.

12. The display panel of claim 11, wherein a plurality of the crossing areas are located within the opening region.

13. The display panel of claim 11, wherein the material of the active layer is metal-oxide-semiconductor.

14. The display panel of claim 11, wherein the third insulation layer comprises a plurality of the opening regions, the opening regions are adjacent to the active layer of the switch element.

15. The display panel of claim 11, wherein the crossing area has a first end and a second end opposite each other in parallel with a first direction which the first trace extends, a shortest distance from the first end to a side of the opening region is not equal to the shortest distance from the second end to an opposite of the opening region.

16. The display panel of claim 11, wherein side slopes of the third insulation layer respectively corresponding to a part of the first trace and a part of the second trace are different.

17. The display panel of claim 16, wherein the opening region further exposes a zone excluding the first trace and the second trace, and the side slopes of the third insulation layer respectively corresponding to the part of the first trace and the zone are different.

18. The display panel of claim 11, further comprising:
a second opening region, having a second longest edge;
a contact hole region, disposed adjacent to the second opening region, and having a second width in a direction substantially perpendicular to the second longest edge of the second opening region, and a shortest distance between a projection of the second longest edge of the second opening region and the contact hole region in the direction substantially perpendicular to the second longest edge of the second opening region is larger than zero and smaller than the second width.

19. The display panel of claim 18, wherein the third insulation layer comprises a plurality of the second opening regions adjacent to the contact hole region.

20. The display panel of claim 11, wherein the display medium layer is a liquid crystal layer or an organic light-emitting diode layer.

* * * * *